United States Patent
Kim et al.

(10) Patent No.: US 12,148,864 B2
(45) Date of Patent: Nov. 19, 2024

(54) DISPLAY DEVICE

(71) Applicant: LG Display Co., Ltd., Seoul (KR)

(72) Inventors: Dojin Kim, Seoul (KR); Seok Kim, Goyang-si (KR); SeongHwan Ju, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 504 days.

(21) Appl. No.: 17/375,909

(22) Filed: Jul. 14, 2021

(65) Prior Publication Data

US 2022/0102589 A1    Mar. 31, 2022

(30) Foreign Application Priority Data

Sep. 29, 2020 (KR) .................. 10-2020-0127528

(51) Int. Cl.
*H01L 27/12* (2006.01)
*H01L 33/46* (2010.01)

(52) U.S. Cl.
CPC ............ *H01L 33/46* (2013.01); *H01L 27/124* (2013.01)

(58) Field of Classification Search
CPC . H01L 33/46; H01L 27/124; G02F 1/133603; G02F 1/133605
See application file for complete search history.

(56) References Cited

U.S. PATENT DOCUMENTS

| | | | |
|---|---|---|---|
| 2005/0169007 A1* | 8/2005 | Chou | G02F 1/133603 362/555 |
| 2005/0264716 A1* | 12/2005 | Kim | H01L 33/54 257/E33.059 |
| 2009/0195559 A1* | 8/2009 | Verstraete | G09G 3/06 362/97.1 |
| 2012/0268916 A1 | 10/2012 | Yoo | |

FOREIGN PATENT DOCUMENTS

| | | |
|---|---|---|
| JP | 2005-311384 A | 11/2005 |
| JP | 2012-227369 A | 11/2012 |
| JP | 2018-101785 A | 6/2018 |
| KR | 10-2012-0119395 A | 10/2012 |
| KR | 10-2020-0075311 A | 6/2020 |

OTHER PUBLICATIONS

JP 2012227369 A (Kobayashi Shinji et al.) translation (Year: 2012).*

* cited by examiner

*Primary Examiner* — James A Dudek
(74) *Attorney, Agent, or Firm* — Birch, Stewart, Kolasch & Birch, LLP

(57) ABSTRACT

A display device includes a light emitting diode LED element having a horizontal length in an X-axis direction and a vertical length in a Y-axis direction, a driving element connected to the LED element, and a reflective functional layer positioned to overlap an upper portion or a lower portion of the LED element, wherein the reflective functional layer includes a central area overlapping the LED (Continued)

element, an outer area including a graduation smaller than the horizontal length or the vertical length of the LED element, and a peripheral area between the central area and the outer area. Accordingly, it is possible to reduce a contact defect of the light emitting diode and the driving element by checking a position where the light emitting diode is attached on a substrate and a degree of misalignment.

20 Claims, 11 Drawing Sheets

DISPLAY DEVICE

CROSS-REFERENCE TO RELATED APPLICATIONS

This application claims the benefit of and priority to Korean Patent Application No. 10-2020-0127528 filed on Sep. 29, 2020, in the Republic of Korea, the entire contents of which are hereby expressly incorporated by reference into the present application.

BACKGROUND

Technical Field

The present disclosure relates to a display device, and more particularly, to a display device using a light emitting diode (LED).

Discussion of the Related Art

Liquid crystal display devices and organic light emitting display devices are widely applied to screens of electronic devices, such as mobile phones and laptop computers, due to the advantages of being able to provide high-resolution screens and allowing for thinning and weight reduction thereof. As a result, an application range of the display devices is gradually expanding.

However, in the liquid crystal display devices and organic light emitting display devices, there can be a limitation in reducing the size of a bezel area visible to a user, which is an area where an image is not displayed in the display device. For example, in the case of a liquid crystal display device, since a sealant needs to be used to seal liquid crystals and bond upper and lower substrates, there can be a limit to reducing the size of the bezel area.

In addition, in the case of an organic light emitting display device, since an organic light emitting element is formed of an organic material and is very vulnerable to moisture or oxygen, it is necessary to dispose an encapsulation part for protecting the organic light emitting element, so there can be a limit to reducing the size of the bezel area.

Accordingly, when a plurality of liquid crystal display devices or a plurality of organic light emitting display devices are disposed in a tile shape to thereby implement a very large screen, there can be a problem that bezel areas between adjacent devices may be easily recognized by a user.

As an alternative to this, display devices using a small LED as a light emitting element are being studied. Since the LED is formed of an inorganic material rather than an organic material, it has excellent reliability and has a longer lifespan compared to a liquid crystal display device or an organic light emitting display device.

In addition, the LED is an element that is suitable for being applied to a very large screen because it has a high lighting speed, high luminous efficiency and excellent stability due to high impact resistance and can display a high-brightness image.

Various fields of search for display devices including such a small LED are being conducted, and display devices allowing for a reduction in defects that may occur in a manufacturing process are being actively studied.

SUMMARY OF THE DISCLOSURE

In a display device using small light emitting diodes (LEDs), a plurality of light emitting diodes are formed on a growth substrate. In addition, driving elements for driving the light emitting diodes are formed on a substrate separate from the growth substrate. When the substrate on which the driving elements are formed is referred to as a TFT (thin film transistor) substrate, a process of separating the plurality of light emitting diodes from the growth substrate, transferring the plurality of light emitting diodes to the TFT substrate, and connecting them to the driving elements is needed. This can be called a transfer process, and in order to implement a display device using a small LED, the transfer process is an important process.

A general problem in a transfer process in a related art is that the light emitting diodes can be misaligned. When transferring the light emitting diodes, the plurality of light emitting diodes are transferred at once, and after the transfer process is performed several times, a display panel can be implemented. If there is an error in a setting value of equipment, the light emitting diodes that are misaligned are disposed on the display panel, and the misalignment of the light emitting diodes can be detected by finding out pixels marked with dark spots when the light emitting diodes and the driving elements are electrically connected to each other and then, turned on for inspection. When observing the pixels marked with dark spots, it can be seen that there is no abnormality in an exterior state of the light emitting diode but the light emitting diode is not turned on due to an alignment difference of several μm. Therefore, there is a need to reduce a process time and lower a defect rate with an early detection of defects by detecting the misalignment of the light emitting diodes during the process of transferring the light emitting diodes to the TFT substrate.

An aspect of the present disclosure is to provide a display device allowing for an early detection of misalignment of light emitting diodes that can occur during a transfer process of the light emitting diodes.

Objects of the present disclosure are not limited to the above-mentioned objects, and other objects, which are not mentioned above, can be clearly understood by those skilled in the art from the following descriptions A display device according to an exemplary embodiment of the present disclosure includes a light emitting diode LED element having a horizontal length in an X-axis direction and a vertical length in a Y-axis direction, a driving element connected to the LED element, and a reflective functional layer positioned to overlap an upper portion or a lower portion of the LED element, wherein the reflective functional layer includes a central area overlapping the LED element, an outer area including a graduation smaller than the horizontal length or the vertical length of the LED element, and a peripheral area between the central area and the outer area. Accordingly, it is possible to reduce a contact defect of the light emitting diode and the driving element by checking a position where the light emitting diode is attached on a substrate and a degree of misalignment.

A display device according to an exemplary embodiment of the present disclosure includes a light emitting diode LED element including a p-electrode and an n-electrode, a driving element connected to the LED element, an insulating layer covering the LED element and including a first hole, a second hole, a third hole, and a fourth hole, and a measurer located around the LED element on the insulating layer, wherein the measurer includes an auxiliary area overlapping the first hole and the second hole, and a guide area including a graduation smaller than a horizontal length or a vertical length of the LED element. Accordingly, it is possible to reduce a contact defect of the light emitting diode and the driving element by checking a position where the light emitting diode is attached on a substrate and a degree of misalignment.

Other detailed matters of the exemplary embodiments are included in the detailed description and the drawings.

According to the present disclosure, a measurer is disposed to overlap a light emitting diode, so that it is possible to easily check whether the light emitting diode is misaligned after transferring the light emitting diode to a substrate.

According to the present disclosure, the measure can reflect light emitted from the light emitting diode upwardly by including a reflective material.

The effects and advantages according to the present disclosure are not limited to the contents exemplified above, and more various effects and advantages are included in the present specification.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
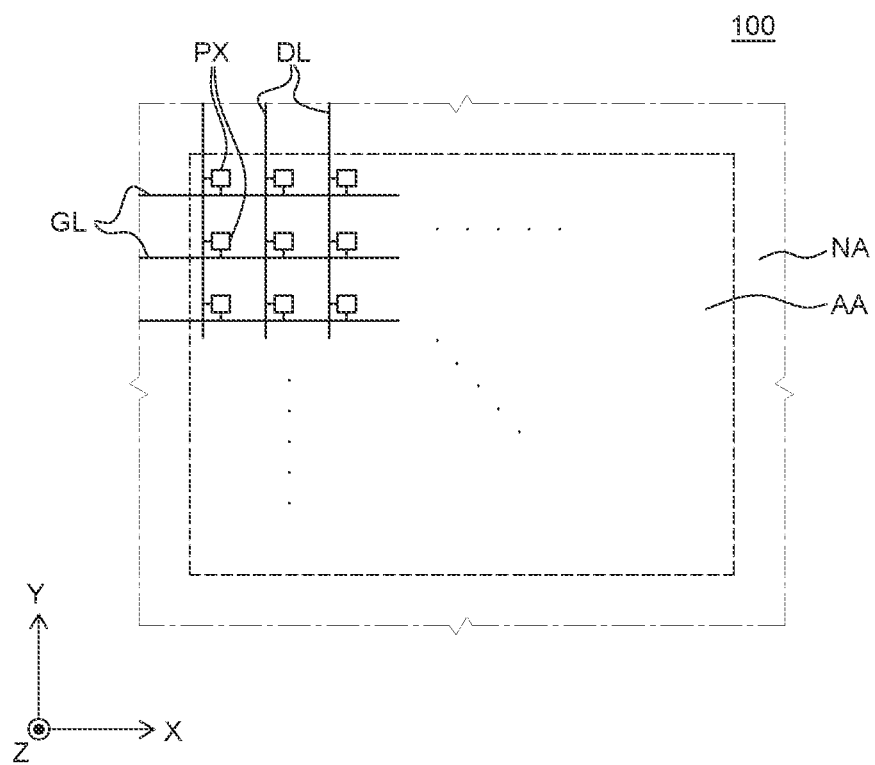
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not necessarily define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

Figure 2:
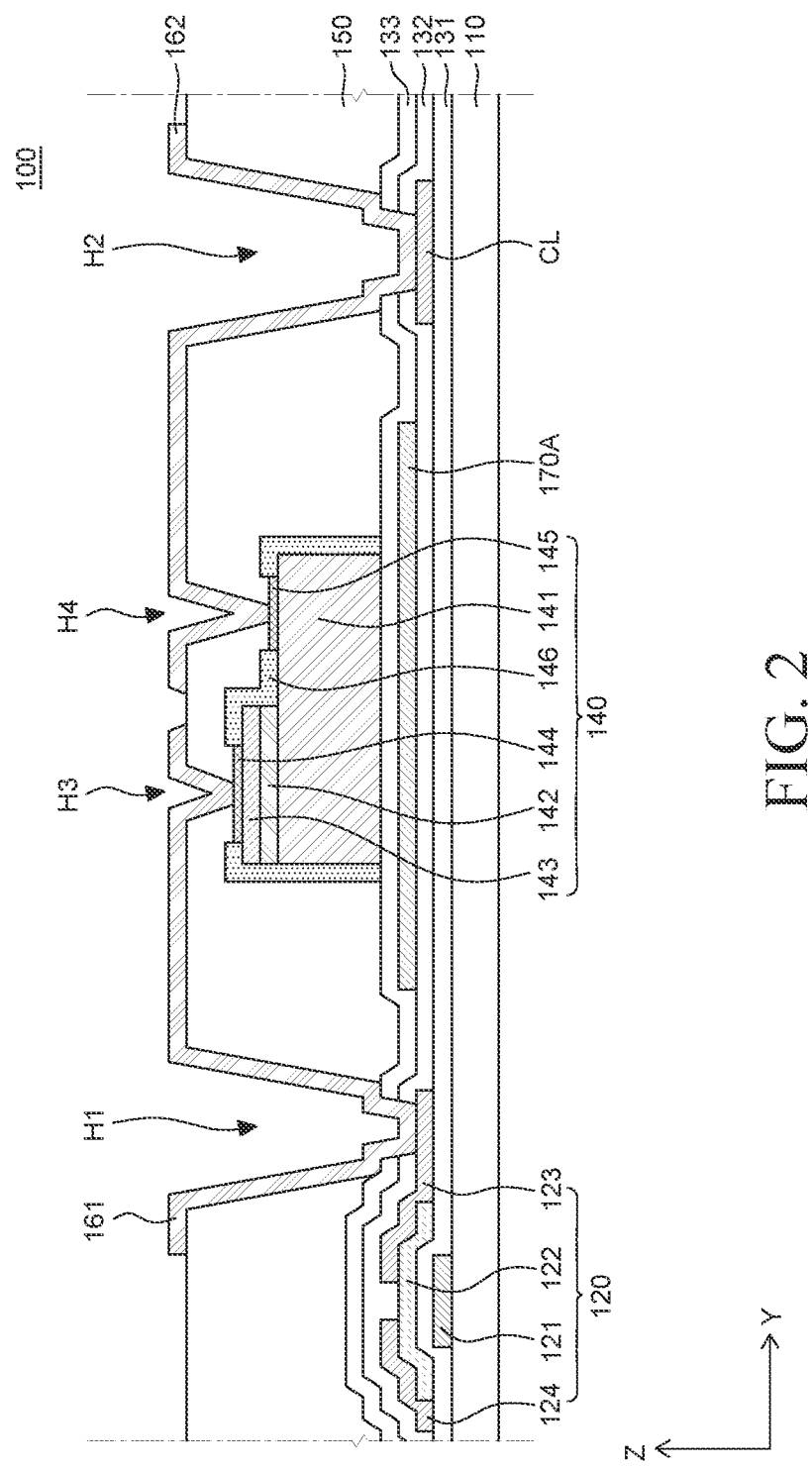
FIG. 2 is a cross-sectional view illustrating a portion of the display device according to an exemplary embodiment of the present disclosure.
Figure 3:
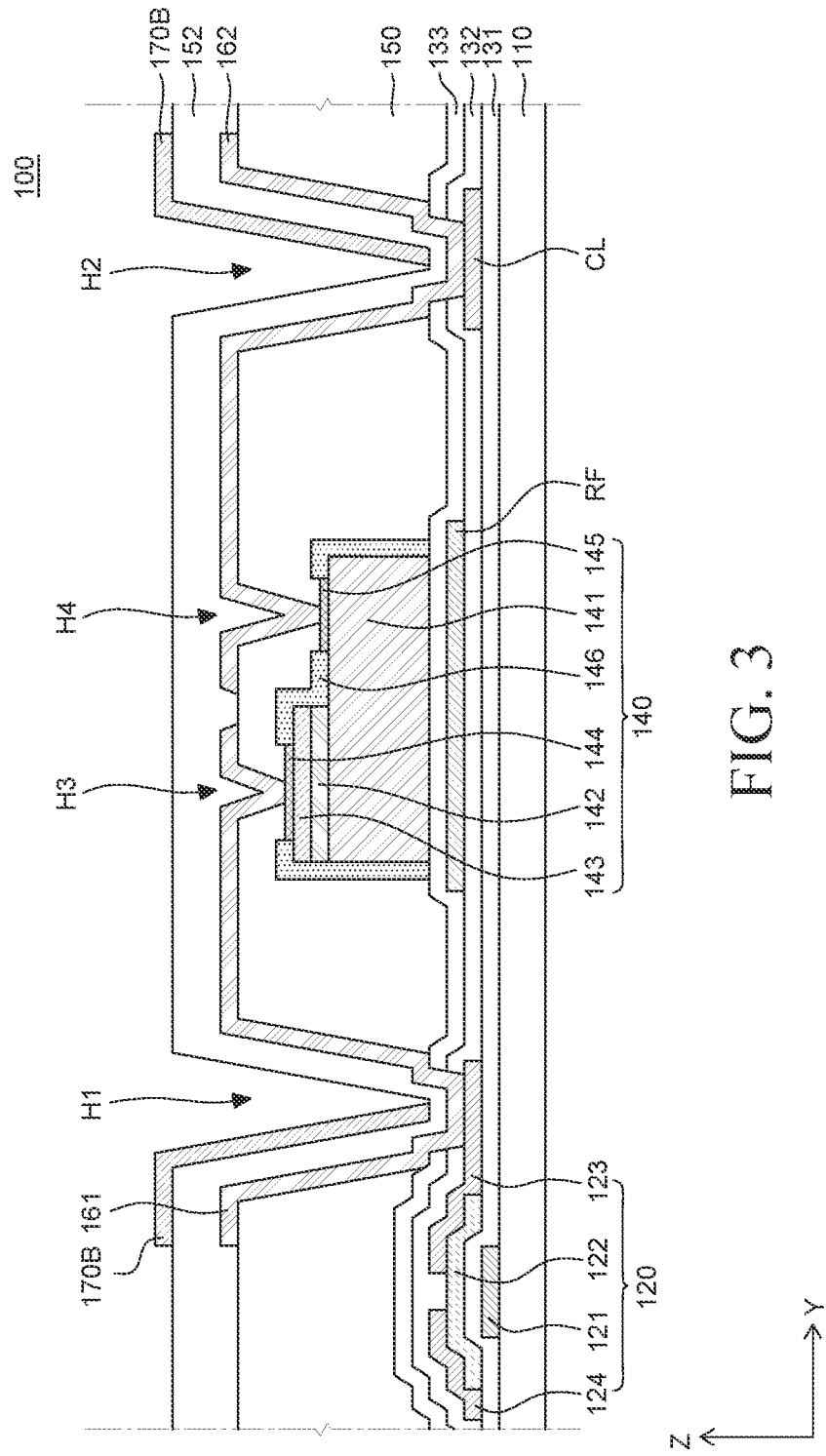
FIG. 3 is a cross-sectional view illustrating a portion of the display device according to an exemplary embodiment of the present disclosure.

FIG. 1 is a plan view of a display device according to an exemplary embodiment of the present disclosure, and FIGS. 2 and 3 are cross-sectional views each illustrating a portion of the display device according to an exemplary embodiment of the present disclosure.

A display device 100 illustrated in FIG. 1 includes a display area AA and a non-display area NA. A plurality of pixels PX are provided in the display area AA, and a pad part for connecting the pixels PX and a pixel driver is disposed in the non-display area NA. In this case, the non-display area NA is only separated for explanation of the disclosure, and the non-display area NA does not necessarily mean a bezel area that is visually recognized by a user's eyes. For example, a width of the non-display area NA can be less than half of an interval between the pixels PX adjacent disposed in the display area AA. When the display device 100 of the present disclosure is provided in plural and the plurality of display devices 100 are disposed in a tile form, a zero bezel in which a gap between the display devices 100 is not visually recognized can be implemented, so that the plurality of tiled display devices 100 can be recognized as a large panel. Accordingly, the display device 100 according to an exemplary embodiment of the present disclosure may not include an area by which the non-display area NA can be defined.

The pixels PX are individual units from which light is emitted, and can include a plurality of light emitting elements and a plurality of pixel circuits for individually driving the plurality of light emitting elements.

One pixel PX can be defined as a unit pixel composed of a plurality of light emitting elements that respectively emit light of different colors. For example, the pixel PX can include light emitting elements that emit red light, green light, and blue light, respectively. However, it is not necessarily limited thereto. For example, the pixel PX can be defined as a sub-pixel composed of one light emitting element. Meanwhile, a light emitting diode (LED) 140 formed of an inorganic material can be used as the light emitting element. In general, if a size of the light emitting diode 140 is 100 micrometers (μm) or less, it is referred to as a micro-LED, and if the size of the light emitting diode 140 is 100 micrometers (μm) or more, it is referred to as a mini-LED.

The pixel circuit can include a plurality of semiconductor elements 120. The light emitting diodes 140 and the semiconductor elements 120 included in the pixel PX can be connected to a pixel driver including a gate control circuit and a data control circuit through a plurality of lines such as a gate line GL and a data line DL.

The light emitting diode 140, the pixel circuit, and the plurality of lines can be disposed on a substrate 110, and the pixel driver can be disposed below the substrate 110. Further, a plurality of connection lines connecting the pixels PX and the pixel driver can be disposed on a side surface of the substrate 110.

FIG. 2 is a vertical cross-sectional view illustrating the semiconductor element 120, the light emitting diode 140, and structures surrounding them. Referring to FIG. 2, the display device 100 according to an exemplary embodiment of the present disclosure can include the substrate 110, the semiconductor element 120, a gate insulating layer 131, a passivation layer 132, a reflective functional layer 170A, an adhesive layer 133, the light emitting diode 140, a first insulating layer 150, and connection electrodes 161 and 162.

The substrate 110 is a substrate supporting various functional elements, and can be an insulating material. For example, the substrate 110 can contain glass or polyimide. When the substrate 110 has flexibility, the substrate 110 can further include a back plate that is coupled to a rear surface of the substrate 110 to reinforce the substrate 110. The back plate can contain a plastic material, for example, a polyethylene terephthalate material.

The semiconductor element 120 is disposed on the substrate 110. The semiconductor element 120 can be used as a driving element of the display device 100. The semiconductor element 120 can be, for example, a thin film transistor (TFT), an N-channel metal oxide semiconductor (NMOS), a P-channel metal oxide semiconductor (PMOS), a complementary metal oxide semiconductor (CMOS), a field effect transistor (FET) or the like, but is not limited thereto. Hereinafter, description will be made on the assumption that the plurality of semiconductor elements 120 are thin film transistors, but the present disclosure is not limited thereto.

The semiconductor element 120 includes a gate electrode 121, an active layer 122, a source electrode 123, and a drain electrode 124.

The gate electrode 121 is disposed on the substrate 110. The gate electrode 121 can be formed of a conductive material, for example, copper (Cu), aluminum (Al), molybdenum (Mo), titanium (Ti), or an alloy thereof, but is not limited thereto.

The gate insulating layer 131 is disposed on the gate electrode 121. The gate insulating layer 131 is a layer for insulating the gate electrode 121 and the active layer 122 and can be formed of an insulating material. For example, the gate insulating layer 131 can be composed of a single layer or a plurality of layers of silicon oxide (SiOx) or silicon nitride (SiNx), but is not limited thereto.

The active layer 122 is disposed on the gate insulating layer 131. For example, the active layer 122 can be formed of an oxide semiconductor, amorphous silicon, or polysilicon, but is not limited thereto.

The source electrode 123 and the drain electrode 124 are disposed on the active layer 122 to be spaced apart from each other. The source electrode 123 and the drain electrode 124 can be electrically connected to the active layer 122. The source electrode 123 and the drain electrode 124 can be formed of a conductive material, for example, copper (Cu), aluminum (Al), molybdenum (Mo), titanium (Ti), or an alloy thereof, but is not limited thereto.

The passivation layer 132 is disposed on the semiconductor element 120. By including the passivation layer 132, elements disposed under the passivation layer 132, for example, the semiconductor element 120 can be protected. The passivation layer 132 can be composed of a single layer or a plurality of layers of silicon oxide (SiOx) or silicon nitride (SiNx), but is not limited thereto. The passivation layer 132 can include a first hole H1 for electrically connecting the semiconductor element 120 and a first connection electrode 161 and a second hole H2 for electrically connecting a common line CL and a second connection electrode 162.

A buffer layer can be disposed between the substrate 110 and the semiconductor element 120. The buffer layer can minimize diffusion of moisture or impurities from the substrate 110 upwardly of the substrate 110. The buffer layer can be composed of a single layer or a plurality of layers of silicon oxide (SiOx) or silicon nitride (SiNx), but is not limited thereto.

The gate line GL is disposed on the substrate 110 or the buffer layer. The gate line GL can be disposed on the same layer as the gate electrode 121, and the gate line GL can be formed of the same material as the gate electrode 121. The gate line GL can extend in one direction in the display area AA and the non-display area NA.

The data line DL is disposed on the gate insulating layer 131. The data line DL can be disposed on the same layer as the source electrode 123 or the drain electrode 124, and the data line DL can be formed of the same material as the source electrode 123 or the drain electrode 124. The data line DL can extend in one direction in the display area AA and the non-display area NA and can extend in a direction different from the gate line GL.

Further, the common line CL is disposed on the gate insulating layer 131. The common line CL is a line for applying a common voltage to the light emitting diode 140 and can be disposed to be spaced apart from the gate line GL or the data line DL. The common line CL can extend in the same direction as the gate line GL or the data line DL. The common line CL can be formed of the same material as the source electrode 123 and the drain electrode 124, or can be formed of the same material as the gate electrode 121.

The reflective functional layer 170A is disposed on the passivation layer 132. The reflective functional layer 170A is a layer for improving luminous efficiency of the light emitting diode 140. The reflective functional layer 170A reflects light that is directed toward the substrate 110, of light emitted from the light emitting diode 140, upwardly of the display device 100 to thereby emit the light to the outside of the display device 100. The reflective functional layer 170A can be formed of a metallic material that has high reflectivity and is resistant to damage by etching. For example, the reflective functional layer 170A can contain silver (Ag), aluminum (Al), and the like. Since pure silver (Ag) or aluminum (Al) reacts with oxygen or nitrogen and thus, has a decrease in reflectivity, the reflective functional layer 170A can be formed of multiple layers of ITO/Al/ITO or ITO/Ag/ITO, or can be formed by adding impurities of palladium (Pd) or copper (Cu) thereto.

The adhesive layer 133 is disposed on the reflective functional layer 170A. The adhesive layer 133 is a layer for fixing the light emitting diode 140 onto the substrate 110 and can insulate the reflective functional layer 170A formed of the metallic material from the light emitting diode 140. However, the present disclosure is not necessarily limited thereto, and when the light emitting diode is a vertical type having a structure in which one electrode at a lower portion thereof is exposed, the adhesive layer 133 can contain a conductive material so that the one electrode of the light emitting diode and the reflective functional layer 170A can be electrically connected to each other. The adhesive layer 133 can be formed of a heat-curing material or a photo-curing material, and the adhesive layer 133 can be selected from any one of adhesive polymers, epoxy resists, UV resins, polyimides, acrylates, urethanes, and polydimethylsiloxane (PDMS), but is not limited thereto.

The adhesive layer 133 can include a first hole H1 for electrically connecting the semiconductor element 120 and the first connection electrode 161 and a second hole H2 for electrically connecting the common line CL and the second connection electrode 162. In this case, the first hole H1 and the second hole H2 included in the adhesive layer 133 can have a diameter greater than that of the first hole H1 and the second hole H2 included in the passivation layer 132. The adhesive layer 133 can be disposed on an entire surface of the substrate 110 as shown in FIG. 2, but is not limited thereto. For example, the adhesive layer 133 can be patterned in an island shape so as to overlap the light emitting diode 140.

The light emitting diode 140 is disposed on the adhesive layer 133 so as to overlap the reflective functional layer 170A. The light emitting diode 140 includes an n-type layer 141, an active layer 142, a p-type layer 143, an n-electrode 145, a p-electrode 144, and an encapsulation layer 146. Hereinafter, the light emitting diode 140 is described as being an LED having a lateral structure, but is not limited thereto. For example, the display device 100 according to an exemplary embodiment of the present disclosure can include the light emitting diode 140 which is an LED having a vertical structure.

The n-type layer 141 is a semiconductor layer in which free electrons having negative charges move as carriers to generate current, and can be formed of an n-GaN-based material. The n-GaN-based material can be GaN, AlGaN, InGaN, AlInGaN, or the like, and Si, Ge, Se, Te, C and the like can be employed as impurities used for doping the n-type layer 141. In some cases, a buffer layer such as an undoped GaN-based semiconductor layer can be additionally formed between a growth substrate and the n-type layer 141.

The active layer 142 is disposed on the n-type layer 141. The active layer 142 can have a multi-quantum well (MQW) structure having a well layer and a barrier layer having a band gap higher than that of the well layer. For example, the active layer 142 can have a multiple quantum well structure such as InGaN/GaN or the like.

The p-type layer 143 is a semiconductor layer in which holes having positive charges move as carriers to generate current, and can be formed of a p-GaN-based material. The p-GaN-based material can be GaN, AlGaN, InGaN, AlIn-GaN, or the like, and Mg, Zn, Be and the like can be employed as impurities used for doping the p-type layer 143.

The p-electrode 144 is disposed on the p-type layer 143 to form an ohmic contact. The p-electrode 144 can be a transparent conductive material such as indium tin oxide (ITO) or indium zinc oxide (IZO), but is not limited thereto. In addition, the n-electrode 145 for ohmic contact is disposed on the n-type layer 141. The n-electrode 145 can be formed of the same material as the p-electrode 144.

The encapsulation layer 146 for protecting the n-type layer 141 and the p-type layer 143 is disposed on the n-type layer 141 and the p-type layer 143. The encapsulation layer 146 can also be referred to as a protective layer, and can be formed of $SiO_2$, $Si_3N_4$, or resin. The encapsulation layer 146 can be disposed on an entire surface of the light emitting diode 140 except for the lower portion of the light emitting diode 140. However, a portion of the p-electrode 144 and the n-electrode 145 is exposed by the encapsulation layer 146, and the p-electrode 144 is in ohmic-contact with the first connection electrode 161, through exposed region thereof and the n-electrode 145 is in ohmic-contact with the second connection electrode 162, through exposed region thereof. In some embodiments, the encapsulation layer 146 may not be formed on at least a portion of side surfaces of the light emitting diode 140. In particular, the encapsulation layer 146 may not be formed on one side surface of the light emitting diode 140 on which only the n-type layer 141 is located without the p-type layer 143, and such a light emitting diode 140 can be disposed on the substrate while the n-type layer 141 is exposed.

The first insulating layer 150 is disposed on the semiconductor element 120 and the light emitting diode 140. The first insulating layer 150 can be formed of an organic material such as photoacryl, polyimide, benzocyclobutene resin, or acrylate resin, but is not limited thereto.

The first insulating layer 150 can be disposed to cover the entire surface of the substrate 110. In addition, the first insulating layer 150 is disposed adjacent to the side surface of the light emitting diode 140, thereby allowing the light emitting diode 140 to be more strongly fixed onto the substrate 110.

The first insulating layer 150 can planarize regions between the plurality of light emitting diodes 140. The first insulating layer 150 compensates for a step difference on the substrate 110 due to the semiconductor element 120, the reflective function layer 170A and the like, so that the connection electrodes 161 and 162 can be connected smoothly to the semiconductor element 120 and the common line CL.

The first insulating layer 150 is disposed so as to surround an upper portion as well as a side portion of the light emitting diode 140. Accordingly, the first insulating layer 150 can more firmly fix light emitting diode 140 aligned on the substrate 110 onto the substrate 110. To this end, a height of the first insulating layer 150 can be greater than a maximum height of the light emitting diode 140. For example, the height of the first insulating layer 150 can be higher than that of the p-type layer 143, the p-electrode 144 or the encapsulation layer 146 of the light emitting diode 140.

The first insulating layer 150 includes a first hole H1 for electrically connecting the semiconductor element 120 and the first connection electrode 161 and a second hole H2 for electrically connecting the common line CL and the second connection electrode 162. In this case, the first hole H1 and the second hole H2 included in the first insulating layer 150 can have a diameter greater than that of the first hole H1 and the second hole H2 included in the adhesive layer 133. Further, the first insulating layer 150 includes a third hole H3 and a fourth hole H4. The third hole H3 exposes the p-electrode 144, and the fourth hole H4 exposes the n-electrode 145. Since the p-electrode 144 is positioned higher than the n-electrode 145, a depth of the third hole H3 can be less than a depth of the fourth hole H4. In addition, an area of the p-electrode 144 that is exposed by the third hole H3 can be larger than an area of the n-electrode 145 that is exposed by the fourth hole H4. Meanwhile, the p-electrode 144 and the n-electrode 145 can be omitted, and in this case, the third hole H3 exposes a portion of the p-type layer 143, and the fourth hole H4 exposes a portion of the n-type layer 141.

The first connection electrode 161 is disposed on the first insulating layer 150 and the light emitting diode 140. The first connection electrode 161 electrically connects the p-electrode 144 of the light emitting diode 140 and the semiconductor element 120 through the third hole H3. The first connection electrode 161 is electrically connected to the source electrode 123 through the first hole H1 and is electrically connected to the p-type layer 143 and the p-electrode 144 through the third hole H3. The first connection electrode 161 can be formed of a transparent conductive material when the display device 100 is a top emission type, and the transparent conductive material can be an indium tin oxide (ITO) or indium zinc oxide (IZO), but is not limited thereto. The first connection electrode 161 can be formed of a reflective conductive material when the display device 100 is a bottom emission type, and the reflective conductive material can be Al, Ag, Au, Pt, or Cu, but is not limited thereto.

The second connection electrode 162 is disposed on the first insulating layer 150 and the light emitting diode 140. The second connection electrode 162 is disposed to be spaced apart from the first connection electrode 161 and electrically connects the n-electrode 145 of the light emitting diode 140 and the common line CL. The second connection electrode 162 is electrically connected to the common line CL through the second hole H2 and is electrically connected to the n-type layer 141 and n-electrode 145 through the fourth hole H4. The second connection electrode 162 can be formed of the same material as the first connection electrode 161 or can be formed of a reflective conductive material depending on a type of the display device 100. The reflective conductive material can be Al, Ag, Au, Pt, or Cu, but is not limited thereto.

The light emitting diodes 140 move onto the substrate 110 and then, are subjected to a predetermined pressure, thereby being adhered to the adhesive layer 133, first. In this process, some of the light emitting diodes 140 that are in position can be moved or rotated vertically or horizontally to thereby be misaligned. In addition, the light emitting diodes 140 are moved onto the substrate 110 by transfer equipment, but can be misplaced on the substrate 110 due to an alignment error of the transfer equipment and the like. As described above, the light emitting diodes 140 according to an exemplary embodiment can be fixed onto the substrate 110 while being misaligned or misplaced thereon, and in this case, the third hole H3 and the fourth hole H4 are respectively formed at positions other than on the p-electrode 144 and the n-electrode 145, so that there can occur a problem that the light emitting diode 140 and the semiconductor element 120 or the light emitting diode 140 and the common line CL are not electrically connected to each other.

The display device 100 illustrated in FIG. 2 has a structure in which the reflective functional layer 170A is disposed below the light emitting diode 140, and the display device 100 illustrated in FIG. 3 has a structure in which a reflective layer RF is disposed below the light emitting diode 140 and a reflective functional layer 170B is disposed laterally of the light emitting diode 140. Since the display device 100 illustrated in FIG. 3 differs from the display device 100 illustrated in FIGS. 1 and 2 in terms of dispositions and structures of the reflective layer RF and the reflective functional layer 170B, and other configurations of the display device 100 illustrated in FIG. 3 are substantially identical to those of the display device 100 illustrated in FIGS. 1 and 2, redundant descriptions are omitted or are briefly provided.

Referring to FIG. 2, as described above, the reflective functional layer 170A is disposed below the light emitting diode 140 and serves to reflect light that is directed downwardly of the light emitting diode 140 in an upward direction. The reflective functional layer 170A included in the display device 100 according to an exemplary embodiment of the present disclosure serves not only to reflect light but also serves as a measurer for checking a position where the light emitting diode 140 is attached. The reflective functional layer 170A according to an exemplary embodiment of the present disclosure can be referred to as a measurer. The measurer 170A is disposed to overlap the light emitting diode 140, in a form in which it is greater than a size of the light emitting diode 140 on the plane at the position where the light emitting diode 140 is to be attached. The measurer 170A includes a graduation for measuring a position where the light emitting diode 140 is attached.

Referring to FIG. 3, in the display device 100 according to an exemplary embodiment of the present disclosure, the reflective layer RF is positioned at a position where the reflective functional layer 170A of FIG. 2 is disposed, and the reflective functional layer 170B is disposed laterally of the light emitting diode 140. The reflective layer RF is disposed below the light emitting diode 140 to simply reflect light that is directed downwardly of the light emitting diode 140 in an upward direction. In addition, the reflective functional layer 170B is disposed laterally of the light emitting diode 140 so that the reflective functional layer 170B serves not only to reflect light but also serves as a measurer for checking a position where the light emitting diode 140 is attached.

Specifically, a second insulating layer 152 is disposed on the first connection electrode 161 and the second connection electrode 162. The second insulating layer 152 can be formed of an organic material such as photoacryl, polyimide, benzocyclobutene resin, or acrylate resin, but is not limited thereto. The second insulating layer 152 can be disposed to cover the entire surface of the substrate 110. The second insulating layer 152 can include holes formed in the same positions as the first hole H1 and the second hole H2, respectively. The hole included in the second insulating layer 152 can pass through the active layer 142 of the light emitting diode 140 and be formed at a depth to a point overlapping a side surface of the n-type layer 141. However, each of the holes formed in the second insulating layer 152 prevents the first connection electrode 161 or the second connection electrode 162 from being exposed.

The reflective functional layer 170B is formed in each of the holes of the second insulating layer 152. The reflective functional layer 170B is disposed along a perimeter of an outer inclined surface of the hole, and is partially disposed on the second insulating layer 152. The reflective functional layer 170B should be disposed on an outer inclined surface of a hole included in the second insulating layer 152 so that it can completely reflect light coming from the side surface of the light emitting diode 140. The second insulating layer 152 prevents each of the reflective functional layers 170B from being short-circuited with the first connection electrode 161 or the second connection electrode 162.

The reflective layer RF and the reflective functional layer 170B can be formed of a metallic material having a high reflectivity. For example, it can contain silver (Ag), aluminum (Al), and the like. Since pure silver (Ag) reacts with oxygen or nitrogen and thus, has a decrease in reactivity, the reflective functional layer 170B can be formed of multiple layers of ITO/Ag/ITO or ITO/Al/ITO, or can be formed by adding impurities of palladium (Pd) or copper (Cu) thereto. The reflective layer RF and the reflective functional layers 170B serve to reflect light that is directed downwardly and laterally of the light emitting diode 140, in an upward direction. The reflective functional layers 170B included in the display device 100 according to an exemplary embodiment of the present disclosure serve not only to reflect light but also serve as a measurer for checking a position where the light emitting diode 140 is attached. The reflective functional layer 170B according to an exemplary embodiment of the present disclosure can be referred to as a measurer. The measurers are disposed to surround the side surfaces of the light emitting diode 140 and include a graduation for measuring a position where the light emitting diode 140 is attached.

According to the cross-sectional views shown in FIGS. 2 and 3, the positions of the reflective functional layers 170A and 170B can be defined as being downwardly or laterally of the light emitting diode 140, and detailed structures of the reflective functional layers 170A and 170B will be described through plan views of FIGS. 4, 5, and 6.

Figure 4:
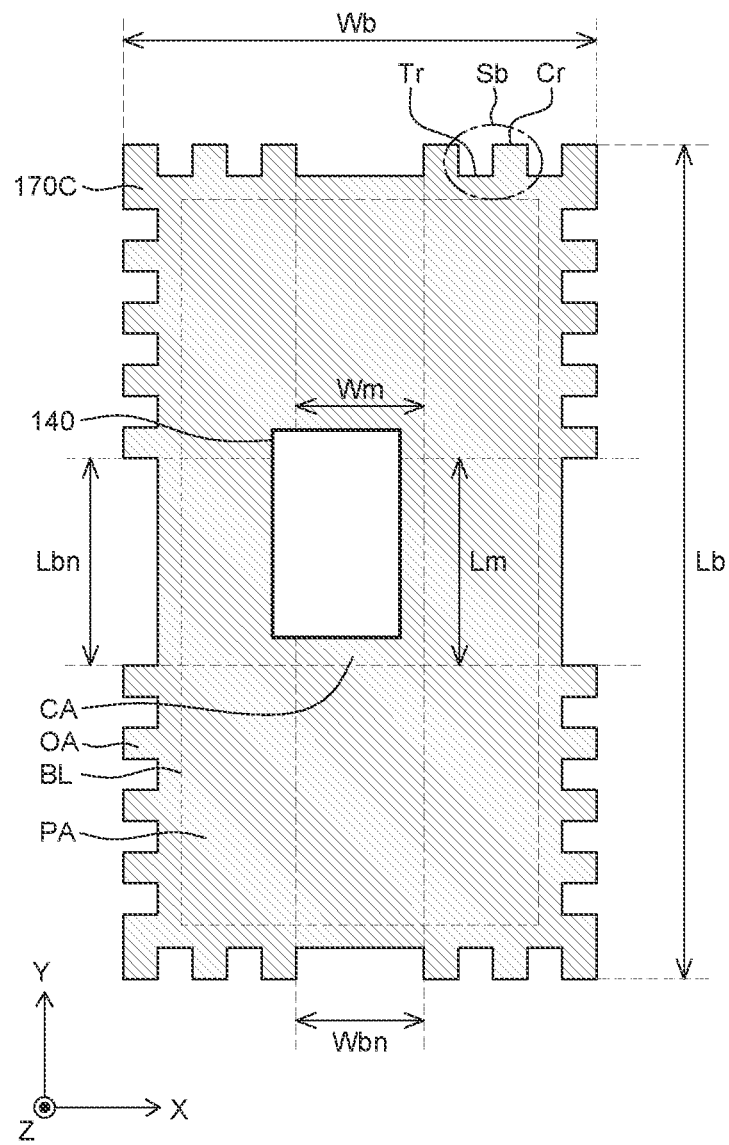
FIGS. 4, 5, and 6 are plan views of measurers according to various exemplary embodiments of the display device illustrated in FIGS. 2 and 3.
Figure 5:
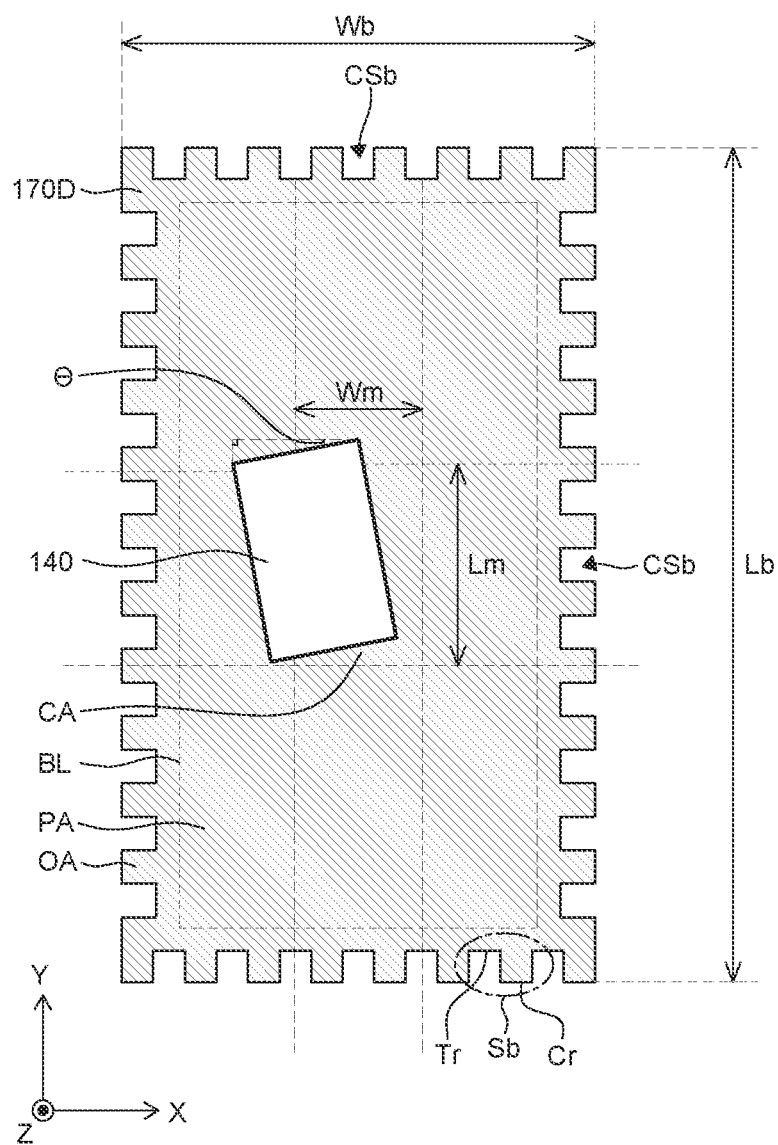
Figure 6:
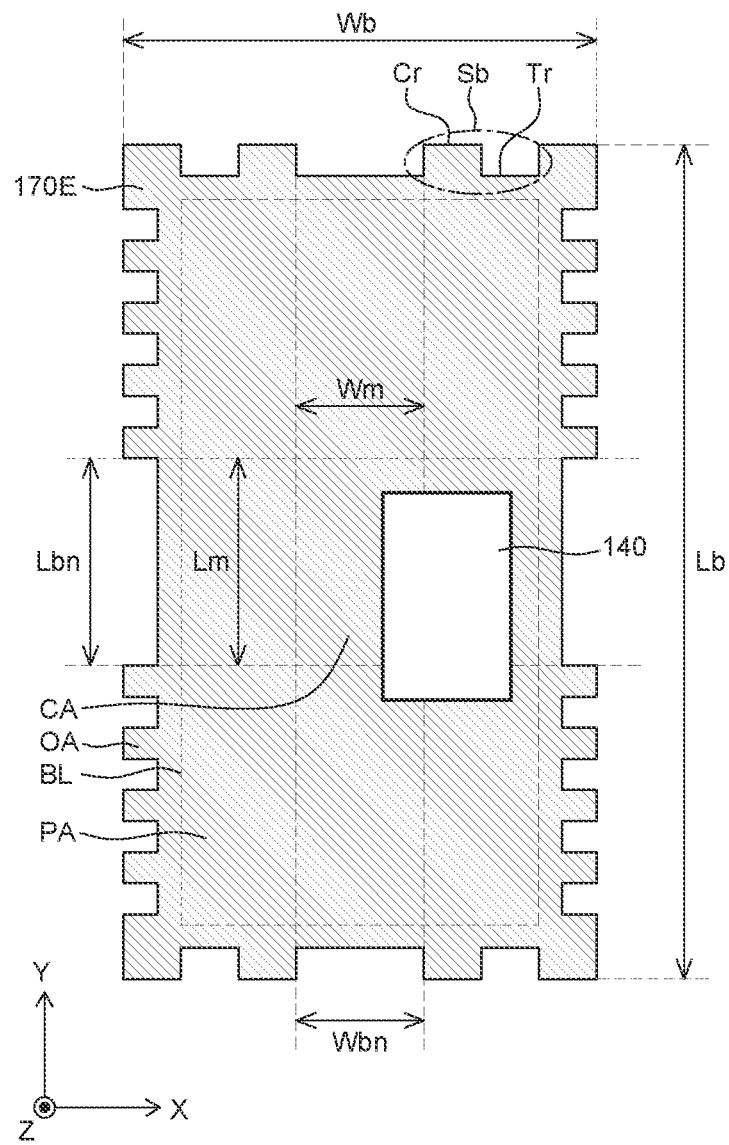

FIGS. 4, 5, and 6 are plan views of measurers according to various exemplary embodiments of the display device illustrated in FIGS. 2 and 3.

FIG. 4 is a plan view of a reflective functional layer 170C included in the display device 100 according to an exemplary embodiment of the present disclosure. Assuming that the reflective functional layer 170C is on an XY plane, the light emitting diode 140 can be located on a Z-axis.

The reflective functional layer 170C included in the display device 100 according to an exemplary embodiment of the present disclosure can be divided into a central area CA, a peripheral area PA, and an outer area OA. The central area CA, a portion overlapping the light emitting diode 140 when the light emitting diode 140 is positioned without misalignment, is an area that includes a center of the reflective functional layer 170C, physically.

In the reflective functional layer 170C, a length of a portion having the greatest width on an X-axis can be defined as Wb, and a length of a portion having the greatest width on a Y-axis can be defined as Lb. A portion where a Y-axis directional virtual line that divides Wb in half and an X-axis directional virtual line that divides Lb in half meet is the center of the reflective functional layer 170C. When a center of the light emitting diode 140 is overlapped with the center of the reflective functional layer 170C, an area of the reflective functional layer 170C overlapping the light emitting diode 140 can be referred to as the central area CA.

The reflective functional layer 170C can include the outer area OA that is an edge area. The outer area OA is an area where graduations Sb are disposed. The graduation Sb includes a recessed portion Tr and a protruding portion Cr, so that the position where the light emitting diode 140 is attached can be intuitively known. When a structure including one recessed portion Tr and one protruding portion Cr is referred to as a unit graduation Sb, a plurality of such unit graduations Sb are disposed in the outer area OA. Since the outer area OA includes the graduations Sb, it can be referred to as a guide area.

The reflective functional layer 170C can include the peripheral area PA positioned between the central area CA and the outer area OA described above. The central area CA and the peripheral area PA mainly reflect light of the light emitting diode 140 and emit the light upwardly.

Referring to FIG. 4, the graduation Sb may not be included in areas corresponding to the central area CA in the outer area OA of the reflective functional layer 170C. For example, when a vertical length of the light emitting diode 140 is greater than a horizontal length thereof, the light emitting diode 140 that is not misaligned can be disposed horizontally on the X-axis and vertically the Y-axis, respectively. In this case, assuming that the horizontal length of the light emitting diode 140 is Wm and the vertical length of the light emitting diode 140 is Lm, areas Wbn and Lbn corresponding to Wm and Lm, respectively, in the outer area OA of the reflective functional layer 170C, may not include the graduation Sb. For example, a portion of the outer area OA overlapping the first hole H1 and the second hole H2 may not include the graduation Sb, and it can be referred to as an auxiliary area.

When the light emitting diode 140 is transferred to the substrate 110, if it is not misaligned, it can be disposed to overlap the central area CA of the reflective functional layer 170C, but if it is misaligned, it can be disposed to overlap the central area CA and the peripheral area PA of the reflective functional layer 170C. Since a process of transferring the light emitting diode 140 to the substrate 110 is due to an effort to overlap the light emitting diode 140 with the central area CA of the reflective functional layer 170C, it can be effective not to include the graduation Sb in the areas corresponding to the central area CA in the outer area OA. In this case, the graduations Sb disposed adjacent to the area Lbn and the area Wbn of the reflective functional layer 170C allow that the protruding portion Cr can be disposed first.

Looking at a positional relationship between the light emitting diode 140 and the reflective functional layer 170C included in the display device 100 according to an exemplary embodiment illustrated in FIG. 4, the light emitting diode 140 is disposed by being moved in a −(minus) X-axis direction and in a +(plus) Y-axis direction from the central area CA of the reflective functional layer 170C.

In the case of the display device 100 according to an exemplary embodiment of the present disclosure, after transferring the light emitting diode 140 onto the substrate 110, an inspector can visually check a degree of misalignment of the light emitting diode 140. When lengths of the protruding portion Cr and the recessed portion Tr included in the unit graduation Sb are identical to each other, according to FIG. 4, the degree of misalignment of the light emitting diode 140 does not exceed half a length of one unit graduation Sb, in both the X-axis direction and the Y-axis direction. Depending on a size of the graduation Sb, the embodiment of FIG. 4 can be regarded as defective or good. The size of the unit graduation Sb will be described later in detail. If it is defective, the transfer process of the light emitting diode 140 is stopped, and after performing an operation for correcting misalignment, the transfer process is continued, thereby shortening a process time and reducing costs.

Referring to FIG. 5, in a reflective functional layer 170D, the area Lbn and the area Wbn of the reflective functional layer 170C described above do not exist, and the graduations Sb are continuously disposed in an entire area of the outer area OA of the reflective functional layer 170D. In this case, each of the graduations Sb disposed on an X-axis and the graduations Sb disposed on a Y-axis can include a central graduation CSb. The central graduations CSb are disposed in areas corresponding to a center of the reflective functional layer 170D in the outer area OA. In FIG. 5, the central graduation CSb is implemented as a recessed portion Tr, but is not limited thereto, and the central graduation CSb can be implemented as a protruding portion Cr.

Looking at a positional relationship between the light emitting diode 140 and the reflective functional layer 170D included in the display device 100 according to an exemplary embodiment illustrated in FIG. 5, the light emitting diode 140 is disposed by being moved in a –(minus) X-axis direction from a central area CA of the reflective functional layer 170D and being rotated counterclockwise. An inspector can check a degree of movement of the light emitting diode 140 in the X-axis direction and a rotation angle Φ through the graduations Sb and the central graduations CSb. The angle Φ at which the light emitting diode 140 is rotated can be figured out, by allowing one surface of the light emitting diode 140 to correspond to the X-axis and the Y-axis to provide a virtual right-angled triangle, as the light emitting diode 140 is rotated, as shown in FIG. 5. Through this, an inspector can determine whether an attachment position of the light emitting diode 140 causes a defect.

In FIGS. 4 and 5 explained above, cases in which all the sizes of the graduations Sb are the same has been described. On the other hand, in the case of a reflective functional layer 170E of FIG. 6, a size of the graduations Sb in the outer area OA, which are provided in the X-axis direction is different from a size of the graduations Sb in the outer area OA, which are provided in the Y-axis direction. In this case, it has been shown that the size of the graduations Sb in the outer area OA, which are provided in the X-axis direction is larger than the size of the graduations Sb in the outer area OA, which are provided in the Y-axis direction, but the present disclosure is not limited thereto. However, the sizes of the graduations Sb which are provided in the same axis can be the same. In addition, the reflective functional layer 170E of FIG. 6 is illustrated to include the area Lbn and the area Wbn where the graduation Sb is not disposed, like the reflective functional layer 170C of FIG. 4 described above, but the present disclosure is not limited thereto and the graduations Sb can be continuously disposed along the outer area OA as in FIG. 5.

The size of the graduation Sb can be implemented differently according to a movement deviation of the light emitting diode 140. In the case of the reflective functional layer 170E of FIG. 6, when the light emitting diode 140 is attached, an X-axis movement thereof occurs larger than a Y-axis movement thereof. In this case, since a degree of movement of the light emitting diode 140 in the X-axis direction is greater than a degree of movement of the light emitting diode 140 in the Y-axis direction, a degree of precision of the graduations Sb disposed in the X-axis direction do not require to be higher than a degree of precision of the graduations Sb disposed in the Y-axis direction. Accordingly, in the reflective functional layer 170E, the size of the graduations Sb disposed in the X-axis direction can be implemented to be larger than the size of the graduations Sb disposed in the Y-axis direction.

Looking at a positional relationship between the light emitting diode 140 and the reflective functional layer 170E included in the display device 100 according to an exemplary embodiment illustrated in FIG. 6, the light emitting diode 140 is disposed by being moved in a +(plus) X-axis direction and a –(minus) Y-axis direction from a central area CA of the reflective functional layer 170E. According to FIG. 6, the degree of misalignment of the light emitting diode 140 is approximately the sum of one protruding portion Cr and half of the recessed portion Tr of the unit graduation Sb disposed in the X-axis direction on the X-axis. The degree of misalignment of the light emitting diode 140 is approximately one protruding portion Cr of the unit graduation Sb disposed in the Y-axis direction on the Y-axis. Depending on the size of the graduation Sb, the embodiment of FIG. 6 can be regarded as defective or good.

All of the reflective functional layers 170C, 170D, and 170E illustrated in FIGS. 4, 5, and 6 described so far can be applied to the display device 100 of FIGS. 2 and 3. When the reflective functional layer 170C, 170D, or 170E is applied to the display device 100 of FIG. 2, it can be disposed below the light emitting diode 140 at the position of the reflective functional layer 170A. In addition, when applied to the display device 100 of FIG. 3, the central area CA and the peripheral area PA included in the reflective functional layer 170C, 170D or 170E are omitted, and only the outer area OA can be disposed at the position of the reflective functional layer 170B of FIG. 3.

FIGS. 7 to 11 are detailed views illustrating graduations included in a measurer according to one or more embodiments of the present disclosure.

Figure 7:
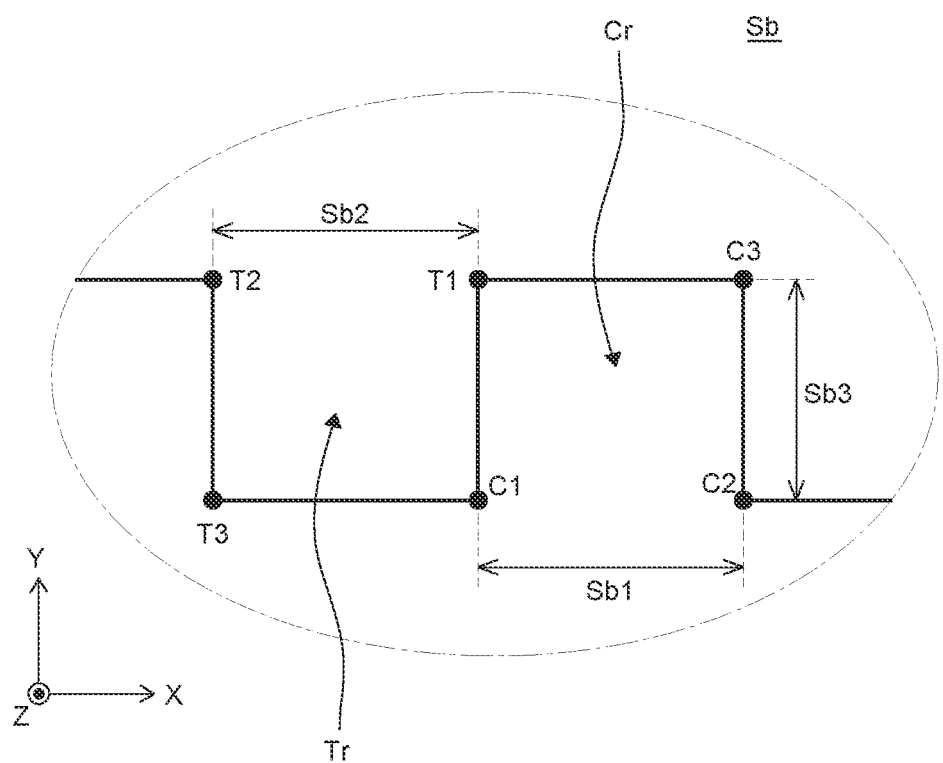
FIGS. 7 to 11 are detailed views illustrating graduations included in a measurer according to one or more embodiments of the present disclosure.
Figure 8:
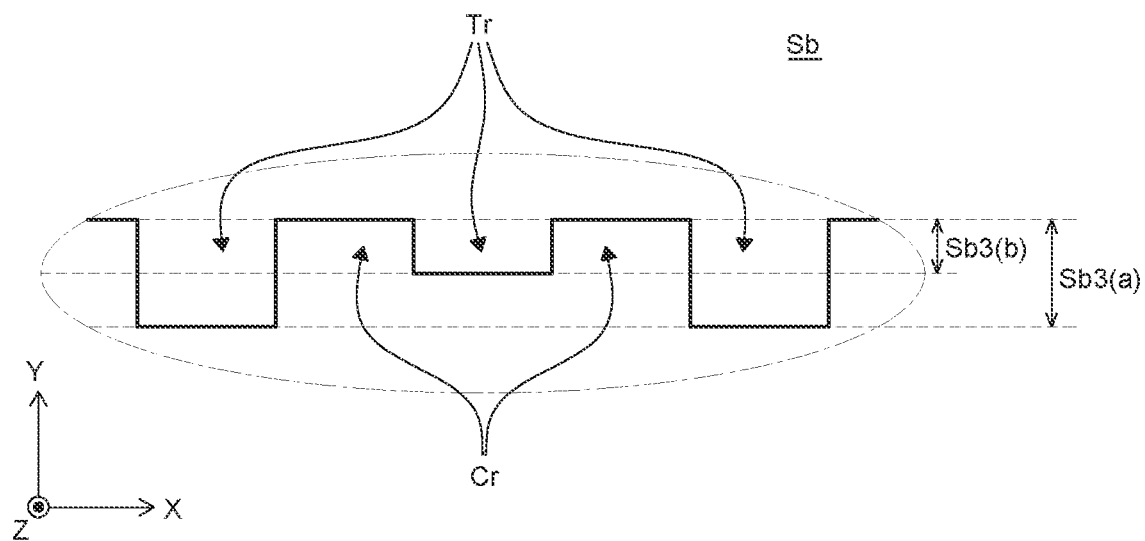

The graduation described in FIG. 7 can be included in the reflective functional layers 170C, 170D, and 170E shown in FIGS. 4, 5, and 6, respectively.

FIG. 7 illustrates a unit graduation Sb including a protruding portion Cr and a recessed portion Tr. Each of the protruding portion Cr and the recessed portion Tr can be implemented with three points. The protruding portion Cr is implemented with protruding portion width reference points C1 and C2 and a protruding portion shape reference point C3, and the protruding portion width reference points C1 and C2 includes a first protruding portion width reference point C1 and a second protruding portion width reference point C2. And, the recessed portion Tr is implemented with recessed portion width reference points T1 and T2 and a recessed portion shape reference point T3, and the recessed portion width reference points T1 and T2 include a first recessed portion width reference point T1 and a second recessed portion width reference point T2. In FIG. 7, the protruding portion Cr and the recessed portion Tr are each implemented in a quadrangular shape, but as long as only the aforementioned width reference points C1, C2, T1 and T2 and shape reference points C3 and T3 can be defined, lines connecting the respective points can be freely used as straight lines or curved lines, and the protruding portion Cr and the recessed portion Tr can be implemented in various shapes.

The width reference points C1 and C2 are points that define a width of the protruding portion Cr, and the width reference points T1 and T2 are points that define a width of the recessed portion Tr. The degree of misalignment of the light emitting diode 140 can be figured out through the width reference points C1, C2, T1, and T2. In this case, the width of the protruding portion Cr corresponds to a width of a first graduation and is denoted as Sb1. The width of the recessed portion Tr corresponds to a width of a second graduation, and is denoted as Sb2. It can be effective to implement the graduation Sb so that lengths of Sb1 and Sb2 are identical to each other in order for an inspector to easily figure out movement values of the light emitting diode 140.

Assuming that the graduation Sb of FIG. 7 is a portion disposed on an upper portion of the reflective functional layers 170C, 170D or 170E, the first protruding portion width reference point C1 and the second protruding portion width reference point C2 can be disposed at different points on the X-axis (e.g., they are separated from each other along the X direction) and can be disposed at the same point on the Y-axis (e.g., they are at the same level along the Y-direction). In a similar manner, the first recessed portion width reference point T1 and the second recessed portion width reference point T2 can be disposed at different points on the X-axis and can be disposed at the same point on the Y-axis. In addition, any one of the protruding portion width reference points C1 and C2 and any one of the recessed portion width reference points T1 and T2 can be disposed at the same point on the X-axis and can be disposed at different points on the Y-axis. In FIG. 7, it is illustrated that the first protruding portion width reference point C1 and the first recessed portion width reference point T1 are disposed at the same point on the X-axis and are disposed at different points on the Y-axis, but the present disclosure is not limited thereto. Accordingly, numerical values of misalignment of the light emitting diode 140 can be figured out only with the widths of each of the protruding portion Cr and the recessed portion Tr.

Heights of the protruding portion Cr and the recessed portion Tr can be defined by two points that are disposed at the same point on the X-axis and disposed at different points on the Y-axis among points that implement the protruding portion Cr and the recessed portion Tr. Specifically, in FIG. 7, a length of a straight line connecting the first protruding portion width reference point C1 and the first recessed portion width reference point T1 can be defined as the heights of the protruding portion Cr and the recessed portion Tr and is denoted as Sb3. It is easy to implement the respective heights of the protruding portion Cr and the recessed portion Tr equally as Sb3, but the present disclosure is not limited thereto. Since the widths of the protruding portion Cr and the recessed portion Tr are important values in figuring out the numerical values of misalignment of the light emitting diode 140, the heights thereof can be implemented to differ from each other. For example, referring to FIG. 8, a plurality of graduations Sb are implemented with two different heights Sb3(a) and Sb3(b). In other words, the recessed portions Tr can be implemented to have different heights alternately for respective recessed portions Tr, but are not limited thereto. The heights Sb3 of the graduations can be regularly disposed with two different heights as in the case of FIG. 8, but can be disposed randomly in some cases. For example, when the widths of the graduations Sb are formed to be small for detailed measurement, if the degree of misalignment of the light emitting diode 140 is considerable, an inspector can be burdened with counting the number of graduations Sb. Therefore, if the heights of the graduations Sb are differently implemented at points where it is unnecessary to count the number of graduations Sb, an inspector can effectively find out the numerical values. For example, the heights of the graduations Sb are differently implemented every odd number, even number, or 10th.

Figure 9:
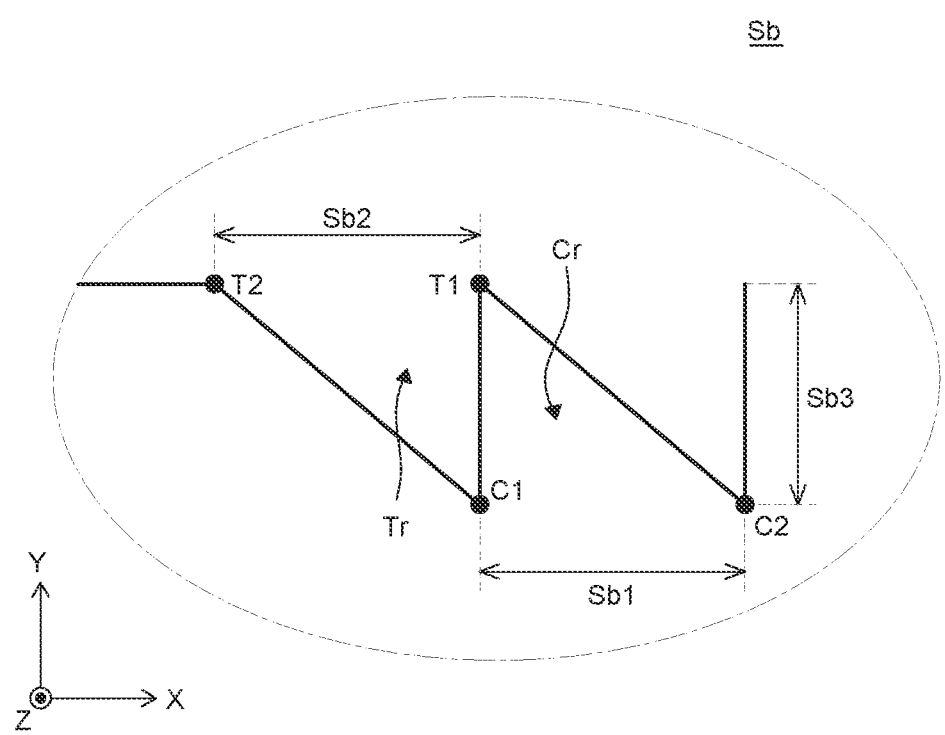

So far, descriptions of the first protruding portion width reference point C1, the second protruding portion width reference point C2, the first recessed portion width reference point T1, and the second recessed portion width reference point T2 have been made, and the graduations Sb can be implemented through these reference points. Referring to FIG. 9, the protruding portion Cr can be implemented with the first protruding portion width reference point C1, the second protruding portion width reference point C2, and the first recessed portion width reference point T1, and the recessed portion Tr can be implemented with the first recessed portion width reference point T1, the second recessed portion width reference point T2, and the first protruding portion width reference point C1. The graduation Sb of the reflective functional layer included in the display device 100 according to an exemplary embodiment can be implemented in a triangular shape.

FIG. 9 illustrates a case in which the first protruding portion width reference point C1 and the first recessed portion width reference point T1 are disposed at the same point in the X-axis direction and are disposed at different points in the Y-axis direction, but the present disclosure is not limited thereto.

Figure 10:
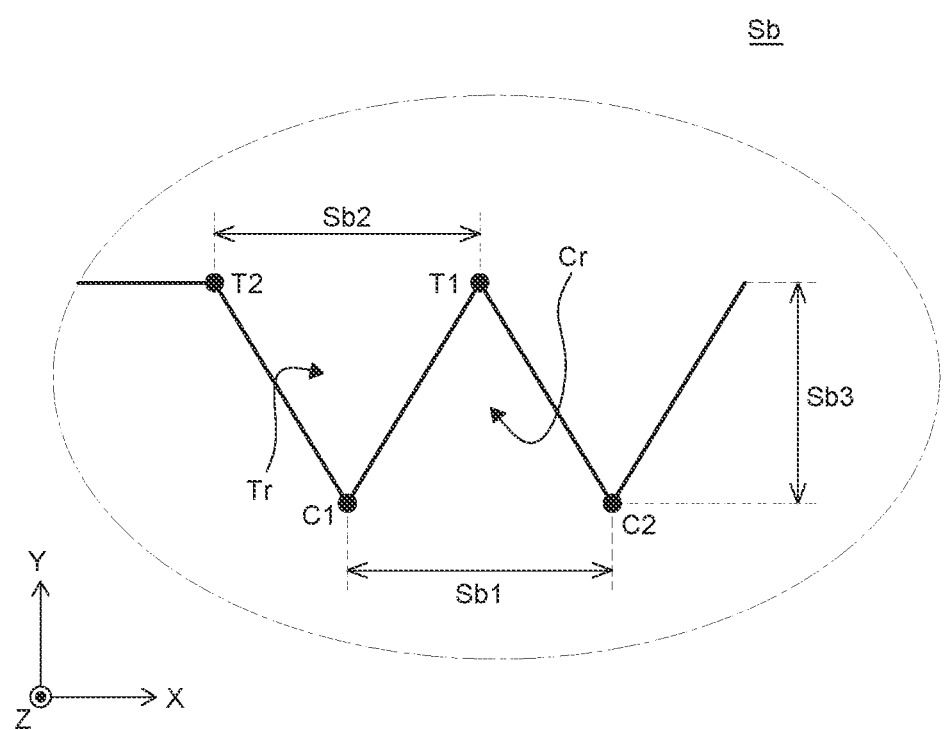

Referring to FIG. 10, the first protruding portion width reference point C1 and the first recessed portion width reference point T1 are not located at the same point in the X-axis direction. The first protruding portion width reference point C1 and the second protruding portion width reference point C2, and the first recessed portion width reference point T1 and the second recessed portion width reference point T2 are not located at the same point in the Y-axis direction. In this case, an inspector can check the degree of misalignment of the light emitting diode 140 through the width Sb1 of the protruding portion Cr.

Referring to FIG. 7, the reflective functional layers included in the display device 100 according to an exemplary embodiment of the present disclosure include the graduations Sb, and the graduations Sb can include the protruding portion shape reference point C3 and the recessed portion shape reference point T3. The protruding portion shape reference point C3 may be between the first protruding portion width reference point C1 and the second protruding portion width reference point C2 in the X-axis and may be present at the same point as the first recessed portion width reference point T1 in the Y-axis. The protruding portion shape reference point C3 can be at a point different from the first recessed portion width reference point T1 and can be present at the same point as the second protruding portion width reference point C2, on the X-axis. The recessed portion shape reference point T3 is between the first recessed portion width reference point T1 and the second recessed portion width reference point T2 on the X-axis and may be present at the same point as the first protruding portion width reference point C1 on the Y-axis. The recessed portion shape reference point T3 can be at a point different from the first protruding portion width reference point C1 and can be at the same point as the second recessed portion width reference point T2, on the X-axis. The shape reference points C3 and T3 can help to secure visibility of the graduation Sb.

Figure 11:
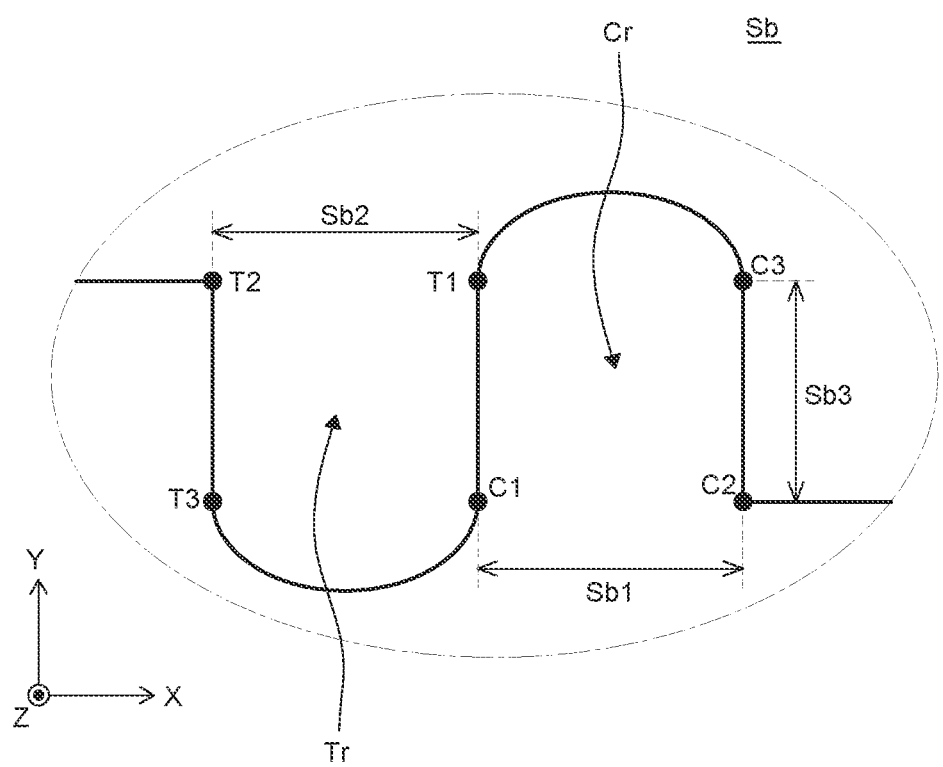

Referring to FIG. 11, in the protruding portion Cr, a line connecting the first recessed portion width reference point T1 and the protruding portion shape reference point C3 can be a curved line. In FIG. 11, the line is illustrated as protruding in a +(plus) Y-axis direction, but it is not limited thereto and can be formed to be recessed in a −(minus) Y-axis direction. In a similar manner, in the recessed portion Tr, a line connecting the first protruding portion width reference point C1 and the recessed portion shape reference point T3 can be a curved line. In FIG. 11, the line is illustrated as being recessed in the −(minus) Y-axis direction, but it is not limited thereto and can be formed to protrude in the +(plus) Y-axis direction.

In the graduations Sb shown in FIGS. 7 to 11, the width Sb1 of the first graduation and the width Sb2 of the second graduation can be determined according to an attachment margin of the light emitting diode 140. The attachment margin of the light emitting diode 140 can be expressed as a ratio of the horizontal length Wm and the vertical length Lm of the light emitting diode 140. When the vertical length Lm of the light emitting diode 140 is greater than the horizontal length Wm, the p-electrode 144 and the n-electrode 145 can be disposed in the Y-axis direction. The attachment margin of the light emitting diode 140 is greater in a direction perpendicular to the direction in which the p-electrode 144 and the n-electrode 145 are disposed than in the direction in which the p-electrode 144 and the n-electrode 145 are disposed. For example, when the vertical length of the light emitting diode 140 is 1.5 to 2 times the horizontal length, the attachment margin of the light emitting diode 140 in the X-axis direction can be equal to or greater than 90% and equal to or less than 100% of the horizontal length of the light emitting diode 140. The attachment margin in the Y-axis direction can be equal to or greater than 20% and equal to or less than 30% of the vertical length of the light emitting diode 140. In addition, the attachment margin of the light emitting diode 140 in the X-axis direction can be twice as much as the attachment margin of the light emitting diode 140 in the Y-axis direction. The width Sb1 of the first graduation and the width Sb2 of the second graduation are smaller than a value of a smaller margin among the attachment margin in the X-axis direction and the attachment margin in the Y-axis direction, so that numerical values due to the misalignment of the light emitting diode 140 can be figured out. For more accurate checking, the width Sb1 of the first graduation and the width Sb2 of the second graduation can be half or less of a smaller value among the attachment margin in the X-axis direction and the attachment margin in the Y-axis direction.

Even in the case of FIG. 6 described above, since the attachment margin of the light emitting diode 140 in the X-axis is greater than the attachment margin of the light emitting diode 140 in the Y-axis, the widths of the graduations disposed in the X-axis direction can be implemented to be greater than widths of the graduations disposed in the Y-axis direction. For example, when both the horizontal length and the vertical length of the light emitting diode 140 are 50 μm or less, the width Sb1 of the first graduation and the width Sb2 of the second graduation can be 2 μm to 5 μm.

The exemplary embodiments of the present disclosure can also be described as follows:

According to an aspect of the present disclosure, there is provided a display device. The display device includes a light emitting diode LED element having a horizontal length in an X-axis direction and a vertical length in a Y-axis direction, a driving element connected to the LED element, and a reflective functional layer positioned to overlap an upper portion or a lower portion of the LED element. The reflective functional layer includes, a central area overlapping the LED element, an outer area including a graduation smaller than the horizontal length or the vertical length of the LED element, and a peripheral area between the central area and the outer area.

The outer area can be all filled with the graduation.

The graduation can be located in an area except for portions of the outer area that correspond to the horizontal length and the vertical length of the LED element relative to a center of the reflective functional layer.

The graduation can include at least two graduations having different sizes.

The graduation can include two graduations having different sizes. A larger graduation of the two graduations can be disposed in a direction in which a movement deviation is greater among a horizontal movement deviation and a vertical movement deviation of the LED element.

The graduation can have a quadrangular shape or a triangular shape including a recessed portion and a protruding portion.

The reflective functional layer can be a multilayer of metallic material including Al or Ag.

A size of the reflective functional layer on an XY-axis plane can be larger than a size of the LED element on the XY-axis plane.

According to another aspect of the present disclosure, there is provided a display device. The display device includes a light emitting diode LED element including a p-electrode and an n-electrode, a driving element connected to the LED element, an insulating layer covering the LED element and including a first hole, a second hole, a third hole, and a fourth hole, and a measurer located around the LED element on the insulating layer. The measurer includes an auxiliary area overlapping the first hole and the second hole, and a guide area including a graduation smaller than a horizontal length or a vertical length of the LED element.

The measurer can include a reflective material.

The first hole may expose the driving element and the second hole can expose a common line. The third hole may expose the p-electrode and the fourth hole can expose the n-electrode.

The driving element can include an active layer, a gate electrode, a source electrode, and a drain electrode. The common line can be disposed on the same layer as the source electrode and the drain electrode.

The auxiliary area of the measurer can be disposed on outer inclined surfaces of the first hole and the second hole.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   at least one pixel including a plurality of light emitting diode elements configured to emit lights of different colors, one light emitting diode (LED) element among the plurality of light emitting diode elements having a first length in a first direction and a second length in a second direction crossing the first direction;
   a driving element disposed adjacent to the one LED element, and configured to drive the one LED element included in at the at least one pixel;
   a first connection electrode disposed on and extending to cover the driving element and the one LED element to electrically connect the driving element to the one LED element, wherein a portion of the first connection electrode is disposed on an upper surface of the one LED element; and a reflective functional layer positioned to overlap an upper portion or a lower portion of the one LED element,
wherein the reflective functional layer includes:
- a central area overlapping the one LED element;
- an outer area including at least one graduation smaller than the first length or the second length of the one LED element; and
- a peripheral area between the central area and the outer area.

2. The display device of claim 1, wherein the at least one graduation includes a plurality of graduations extending along the entire outer area of the reflective functional layer.

3. The display device of claim 1, wherein the at least one graduation is located in an area except for portions of the outer area that correspond to the first length and the second length of the one LED element relative to a center of the reflective functional layer.

4. The display device of claim 1, wherein the at least one graduation includes at least two graduations having different sizes.

5. The display device of claim 1, wherein the at least one graduation includes two graduations having different sizes, and
wherein a larger graduation of the two graduations is disposed in a direction in which a movement deviation is greater among a first movement deviation and a second movement deviation of the one LED element being different from the first movement deviation.

6. The display device of claim 1, wherein the at least one graduation has a quadrangular shape or a triangular shape including a recessed portion and a protruding portion.

7. The display device of claim 1, wherein the reflective functional layer is a multilayer of metallic material including Al or Ag.

8. The display device of claim 1, wherein a size of the reflective functional layer on an XY-axis plane is larger than a size of the one LED element on the XY-axis plane.

9. The display device of claim 1, wherein the at least one graduation includes a plurality of recessed portions and a plurality of protruding portions alternatingly arranged along at least some of the outer area of the reflective functional layer.

10. The display device of claim 9, wherein the plurality of recessed portions have different depths.

11. The display device of claim 9, wherein the plurality of recessed portions have slanted surfaces.

12. The display device of claim 9, wherein the plurality of recessed portions have bottom surfaces that are curved, and the plurality of protruding portions have top surfaces that are curved.

13. The display device of claim 1, wherein the reflective functional layer is disposed laterally with respect to the LED element.

14. A display device, comprising:
a plurality of pixels disposed on a substrate and configured to display images,
wherein each of the plurality of pixels includes:
- a plurality of light emitting diode elements configured to emit lights of different colors,
- a plurality of driving elements configured to drive the plurality of light emitting diode elements, respectively, and
- a plurality of reflective functional layers disposed under the plurality of light emitting diode elements, respectively, in a one-to-one relationship, wherein the plurality of reflective functional layers are completely separated from each other with gaps therebetween, and
wherein the reflective functional layer includes:
- a specific area configured to overlap with a corresponding one of the plurality of light emitting diode elements, and
- an outer area surrounding the specific area, and including a plurality of graduations usable for alignment of the corresponding one of the plurality of light emitting diode elements.

15. The display device of claim 14, wherein the plurality of graduations include a plurality of recessed portions and a plurality of protruding portions alternatingly arranged along at least some of an edge portion of the outer area of the reflective functional layer.

16. The display device of claim 14, wherein each of the plurality of pixels further includes:
a plurality of connection electrode disposed on the plurality of driving elements and the plurality of light emitting diode elements, respectively,
wherein for each connection electrode, a portion of the connection electrode is disposed on an upper surface of the corresponding one of the plurality of light emitting diode elements.

17. The display device of claim 1, further comprising:
a common line disposed adjacent to the reflective functional layer; and
an insulating layer disposed on the driving element, the one LED element and the common line.

18. The display device of claim 17, further comprising:
a second connection electrode disposed on the one LED element and the common line, and electrically connecting the one LED element to the common line.

19. The display device of claim 18, wherein the first and second connection electrodes are separated from each other and contact different parts of the one LED element.

20. A display device, comprising:
at least one pixel including a plurality of light emitting diode elements configured to emit lights of different colors, one light emitting diode (LED) element among the plurality of light emitting diode elements having a first length in a first direction and a second length in a second direction crossing the first direction;
a driving element connected to the one LED element and included in at the at least one pixel; and
a reflective functional layer positioned to overlap an upper portion or a lower portion of the one LED element,
wherein the reflective functional layer includes:
- a central area overlapping the one LED element;
- an outer area including at least one graduation smaller than the first length or the second length of the one LED element; and
- a peripheral area between the central area and the outer area,
wherein the at least one graduation includes a plurality of recessed portions and a plurality of protruding portions alternatingly arranged along at least some of the outer area of the reflective functional layer, and
wherein the plurality of recessed portions have slanted surfaces, or the plurality of recessed portions have bottom surfaces that are curved along with the plurality of protruding portions having top surfaces that are curved.

* * * * *